United States Patent [19]

Morris

[11] 4,111,718

[45] Sep. 5, 1978

[54] THERMOCOUPLES OF MOLYBDENUM AND IRIDIUM ALLOYS FOR MORE STABLE VACUUM-HIGH TEMPERATURE PERFORMANCE

[75] Inventor: James F. Morris, Fairview Park, Ohio

[73] Assignee: The United States of America as represented by the National Aeronautics and Space Administration, Washington, D.C.

[21] Appl. No.: 853,679

[22] Filed: Nov. 21, 1977

Related U.S. Application Data

[63] Continuation-in-part of Ser. No. 667,929, Mar. 18, 1976, abandoned.

[51] Int. Cl.² ............................................. H01L 35/20
[52] U.S. Cl. ................................. 136/236 R; 136/202
[58] Field of Search .......... 73/359 R; 136/202, 236 R

[56] References Cited

U.S. PATENT DOCUMENTS

3,836,402   9/1974   Zysk ................................. 136/202 X

FOREIGN PATENT DOCUMENTS

407,658   6/1932   United Kingdom ..................... 136/236
822,916  11/1959   United Kingdom ..................... 136/236

OTHER PUBLICATIONS

Troy et al., American Society for Metal Transactions, vol. 42, 1950, pp. 1131 to 1149.
Nadler et al., Review of Scientific Instruments, vol. 32, No. 1, Jan. 1961, pp. 45 to 47.
Shunk, *Constitution of Binary Alloys, Second Supplement,* 1969, McGraw-Hill Book Co., New York, p. 459.
Javitz, Electro-Technology, vol. 68, Jul. 1961, pp. 11 to 12.

*Primary Examiner*—Leland A. Sebastian
*Attorney, Agent, or Firm*—N. T. Musial; J. R. Manning; G. E. Shook

[57] ABSTRACT

Thermocouples of the present invention provide stability and performance reliability in systems involving high temperatures and vacuums by employing a bimetallic thermocouple sensor wherein each metal of the sensor is selected from a group of metals comprising molybdenum and iridium and alloys containing only those two metals. The molybdenum, iridium thermocouple sensor alloys provide bare metal thermocouple sensors having advantageous vapor pressure compatibilities and performance characteristics. The compatibility and physical characteristics of the thermocouple sensor alloys of the present invention result in improved emf, temperature properties and thermocouple hot junction performance. The thermocouples formed of the molybdenum, iridium alloys exhibit reliability and performance stability in systems involving high temperatures and vacuums and are adaptable to space propulsion and power systems and nuclear environments.

2 Claims, 1 Drawing Figure

THERMOCOUPLES OF MOLYBDENUM AND IRIDIUM ALLOYS FOR MORE STABLE VACUUM-HIGH TEMPERATURE PERFORMANCE

ORIGIN OF THE INVENTION

The invention described herein was made by an employee of the United States Government and may be manufactured or used by or for the Government without the payment of any royalties thereon or therefor.

STATEMENT OF COPENDENCY

This application is a continuation-in-part of application Ser. No. 667,929 which was filed Mar. 18, 1976, now abandoned.

BACKGROUND OF THE INVENTION

1. Field of the Invention

This invention relates to thermocouples and in particular to bimetallic thermocouple sensors composed of metals and alloys having improved reliability and performance characteristics in high-temperature, high-vacuum systems. Thermocouple sensors of the present invention are formed from molybdenum, iridium and alloys thereof to provide a reliable temperature sensing device in high-temperature and vacuum systems. The chemical and physical compatibility of molybdenum with iridium and alloys containing only those two metals provide thermoelectric sensors having reduced thermocouple hot junction failure upon initial heating and emf-temperature performance changes resulting from preferential evaporation of one of the thermocouple elements in vacuums and extended periods of use at temperatures between 1500° and 2400° C.

The thermocouple sensors of the present invention are particularly well suited to bare metal sensor applications in high-temperature, high-vacuum systems but can also be sheathed and insulated for applications in systems up to about 2450° C. Whether sheathed or unsheathed the thermocouples of the present invention provide stability and reliability by utilizing molybdenum and iridium and alloys containing only those two metals in the bimetallic thermocouple sensor to provide a reliable thermocouple having an improved operational life and reliability.

2. Description of the Prior Art

Thermocouples are useful temperature measuring devices which measure temperature by employing dissimilar metal conductors joined at a point where the temperature is to be measured with the free ends connected to an instrument which measures the amount of voltage generated at the junction of the dissimilar metal conductors. The thermocouple sensor or the bimetallic junction of the dissimilar conductors have been formed of various metals such as copper and iron which provide a thermoelectric differential between the two metals upon exposure to heat. These and other metals employed in prior art thermocouple sensors have had the disadvantage of melting at fairly low temperature, i.e., copper, 1083° C., and have required insulation and various sheathing systems to protect the thermocouple during operation at prolonged elevated temperatures and sometimes have resulted in undesirable reactions between the metals in the sensor.

The problems of undesirable reactions in thermocouple sensors have been aggravated by the temperatures encountered in nuclear reactor systems, rocketry heat sensors, high-temperature and vacuum processing and other applications where temperature measurements at or above 1500° are involved. Thermocouples employing bimetallic sensors of tungsten and rhenium with sheathing and insulation have been utilized in an effort to prevent the disintegration of the thermocouple in such systems. The insulation and sheathing systems have had the disadvantage of resulting in time delays in obtaining temperature readings due to the insulation and mechanical failure resulting from such problems as gas leakage at the thermocouple sheath seals, cracked sheaths and other mechanical limitations imposed by ceramic insulated metal sheathed thermocouple sensors.

The tungsten, rhenium thermocouple-sensor combination and other prior art bimetallic bare sensor combinations have generally not proven to be uniformly reliable or to have a useful operational life at temperatures above 1800° C. due to breakage of the thermocouple hot junction upon initial heating and drifts in emf, temperature relationships. These problems are believed to be the result of thermal and chemical phase transitions and of preferential evaporation of one of the metals in the bimetallic sensor. In particular the tungsten, rhenium thermocouple combination has not proven reliable in high-temperature and vacuum systems as a result of high-vapor-pressure differential between rhenium and tungsten. This high-vapor-pressure differential causes thermocouples comprised of these substances to drift in their emf, temperature relationship as a result of preferential losses of rhenium by evaporation at elevated temperatures, particularly in high-vacuum systems.

The problems associated with thermocouples employing bitmetallic sensors of tungsten and rhenium are greatly reduced in thermocouples employing bimetallic sensors of tantalum and rhenium which are the subject of my copending patent application Ser. No. 629,457 filed Nov. 6, 1975 and issued as U.S. Pat. No. 4,045,247. The vapor pressures of tantalum and rhenium match closely, and the thermal limits for such thermocouples approach the melting points of these two metals which range from about 2690° C. to about 3000° C. for high tantalum solid solutions and from about 2755° C. to about 3180° C. for high rhenium solutions.

A desirable matching of vapor pressures also holds for the constituents of thermocouples employing bimetallic sensors employing platinum and rhodium. However, the 1770° C. melting point of platinum restricts the utility of these thermocouples to about 1700° C. or lower.

SUMMARY OF THE INVENTION

The disadvantages and limitations of the prior art are obviated by the present invention which provides a reliable bimetallic thermocouple sensor employing molybdenum and iridium for use in high-temperature and high-vacuum systems which is stable and reliable in bare sensor applications up to about 2450° C., the melting point of iridium. I have found that the vapor pressures of molybdenum and iridium match even better than those for the platinum, rhodium and the tantalum, rhenium systems described in U.S. Pat. No. 4,045,247. The melting points of both molybdenum (2620° C.) and iridium (2450° C.) are much higher than those of platnium and rhodium.

Thermocouples of the present invention utilize a bimetallic thermocouple sensor wherein each of the two metals of the sensor is dissimilar and is selected from the group of metals comprising molybdenum, iridium and alloys containing these two metals. Sensors composed of molybdenum, iridium and alloys containing only these two metals provide advantages over prior art thermocouples as a result of the physical and chemical compatibility of molybdenum and iridium at high temperatures and in vacuum systems. The compatibility of molybdenum and iridium at elevated temperatures reduces the problem of preferential evaporation in the molybdenum, iridium thermocouple sensor to provide a more stable emf, temperature relationship. The vapor pressure and physical and chemical compatibility of molybdenum, iridium and alloys containing only these two metals reduce thermocouple hot-junction failures and allows such sensors to be employed in high-temperature and vacuum systems without the necessity of metallic sheaths and ceramic insulation at operating temperatures up to about 2450° C. The advantages of the present invention are further enhanced over tungsten, rhenium and tantalum, rhenium combinations in that the present invention does not contain rhenium which is often very expensive and sometimes unavailable.

The advantages of the present invention are achieved through the use of bare bimetallic thermocouple sensors utilizing either an iridium and an iridium alloy having about 0 to about $22^a$/o (atomic percent) molybdenum dissolved therein or two dissimilar iridium, molybdenum alloys in that range or, possibly, a molybdenum bimetallic thermocouple sensor utilizing a molybdenum alloy having about 0 to about 4% by weight iridium dissolved therein or two dissimilar iridium, molybdenum alloys in that range. Thermocouples having a bimetallic sensor of iridium and iridium with about 0 to about $22^a$/o molybdenum dissolved therein have melting points in the range of from about 2300° C. to nearly the melting point of oridium at about 2450° C. On the other hand, molybdenum and molybdenum with about 0 to about 4% by weight iridium dissolved therein may not afford compositions differing widely enough to produce practical thermocouples because of the low solubility of iridium in molybdenum. If such thermocouples could be realized practically, they would have melting points approaching the melting point of molybdenum at about 2620° C.

BRIEF DESCRIPTION OF THE DRAWINGS

The foregoing and other advantages and novel features of the invention and objects thereof will be more fully understood from the following brief description when read in connection with the accompanying drawing consisting of a sole FIGURE illustrating a thermocouple constructed in accordance with the invention.

DESCRIPTION OF THE PREFERRED EMBODIMENT

Figure 1:
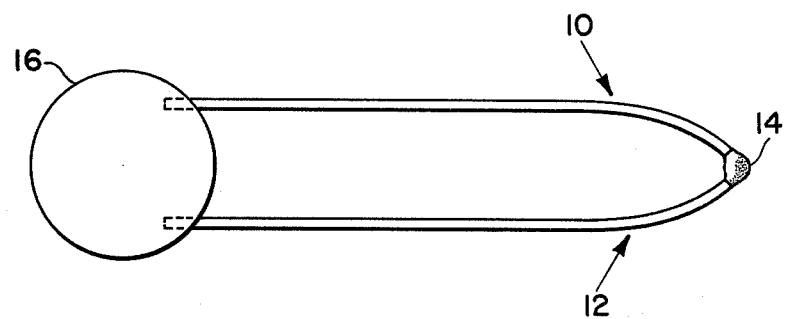

Referring now to the FIGURE, there is shown a thermocouple having a bimetallic sensor in which a pair of bare thermoelectric leg wires 10 and 12 are joined by welding or other means to form a hot junction 14. A potentiometer 16 or other instrument for measuring the difference in electric potential is used to measure the thermoelectric response of the leg wires to heat at the hot junction.

In the preferred embodiment of the present invention each metal of the bimetallic thermocouple sensor is dissimilar and is selected from the group of metals comprising molybdenum, iridium and alloys containing only those two metals. The chemical and physical compatibility of molybdenum with iridium and alloys thereof in high-temperature and vacuum systems allows bare metal thermocouple sensors to be used in high-vacuum, high-temperature applications which have heretofore required the use of insulated and sheathed thermocouples or expensive rhenium alloys. Thermocouples and thermocouple sensors formed in accordance with the present invention provide advantages in reliability, economy, increased operational life and stability at elevated temperatures and in high vacuum environments. The physical and chemical compatibility of molybdenum with iridium and the alloys thereof reduce the emf, temperature relationship drifts that result from the preferential loss of one of the metals by evaporation at high temperatures, as will be discussed in greater detail hereinafter. More specifically, the vaporization rates as of function of temperature for both molybdenum and iridium are given in the following table.

| Temp.° C | Vaporization Rate Mils/Yr. |
| --- | --- |
| 1500 | 0.02 |
| 1600 | 0.2 |
| 1700 | 2 |
| 1800 | 10 |
| 1900 | 70 |
| 2000 | 300 |

At 2000° C. both molybdenum and iridium vaporize at a rate of about ⅓ of an inch per year (8760 hours) in a hard vacuum. This is about 0.04 inch or 40 mils in 1000 hours. In a hard vacuum at 2400° C., molybdenum and iridium both vaporize at over 30 inches per year or about 4 mils per hour. While this vaporization rate is too great for applications which must be measured in terms of a year's service, short term applications on the order of 1 hour are practical in this extreme environment.

The present invention achieves its advantages in part as a result of the advantageous vapor pressure relationship between molybdenum and iridium at elevated temperatures encountered in nuclear reactors, rocket exhausts and in high temperature and vacuum systems. The vapor pressure relationship between iridium and molybdenum is almost coincidental at the temperatures of 1400° C. to 2450° C. This close relationship between the vapor pressure of molybdenum and iridium over this temperature range minimizes problems resulting from the preferential loss of one of the metals by evaporation. In comparison in the tungsten, rhenium thermocouple sensor of the prior art, the vapor pressure of rhenium is approximately twenty times as great as that of tungsten at 2400° C. in a vacuum. This vapor pressure differential in the tungsten, rhenium sensor results in preferential rhenium evaporation and in emf, temperature drifts and deterioration of the thermocouple after about 1000 hours of use. The chemical and physical compatibility of the molybdenum, iridium thermocouples of the present invention prevents the preferential loss of one of the metals by evaporation to provide a thermocouple with an improved useful life and reliability.

The preferred embodiment of the present invention also includes the advantages resulting from the solubility properties of molybdenum in iridium to provide a great selection of materials that may be employed in a bimetallic thermocouple sensor. The preferred embodiment contemplates the utilization of the solubility properties of molybdenum in iridium of about 0 to about $22^a$/o for the selection of two such alloys or an alloy with pure iridium for a thermocouple sensor. The solubility of molybdenum in iridium result in advantages by providing a selection of molybdenum, iridium alloys that may be used in the bimetallic thermocouple sensor. The advantages of the preferred embodiment of the invention provide a selection of alloys for use in bare metal bimetallic thermocouple sensors for use in high temperature and vacuum systems for temperatures up to about 2450° C. without emf, temperature drifts caused by preferential evaporation of one of the metals.

As heretofore discussed thermocouples have found application as heat sensing devices in such fields as nuclear reactors, rocketry and high vacuum and temperature processes. In such systems thermocouples must be able to accurately measure temperatures in excess of 1500° C. for thousands of hours. Under these conditions and particularly those involving vacuum and elevated temperatures most thermocouples exhibit emf, temperature drifts as a result of the preferential evaporation of one of the metals of the thermocouple sensor which results in inaccurate temperature readings.

The preferred embodiment of the present invention reduces the effects of the prior art by the utilization of molybdenum and iridium and alloys thereof as thermocouple sensors which exhibit compatible physical and chemical properties at temperatures and conditions encountered in such applications. The present bare bimetallic thermocouple sensors of molybdenum, iridium alloys are prepared by dissolving molybdenum in iridium in a range of about 0 to 22$^a$/o and joining two dissimilar metals in the aforementioned solubility range of the molybfenum, iridium metals. The thermocouple sensors formed from molybdenum dissolved in iridium having melting points in the range of about 2300° C. to about the melting point of oridium at about 2450° C. depending upon the percentage alloy employed. The melting point of such thermocouples is generally the solidus temperature of the lower-melting point alloy of the bimetallic thermocouple sensor since no eutectics or melting point minima exists in the molybdenum 0 to 22$^a$/o iridium compositions. The molybdenum, iridium bare metal thermocouple sensors in accordance with the preferred embodiment of the present invention are obtained by selecting and joining two dissimilar metals from the group of metals comprising molybdenum, iridium and alloys containing only those two metals.

In some applications a pure-iridium, pure-molybdenum thermocouple sensor may be employed in high-temperature, high-vacuum systems. Generally, however, this combination is not preferred in high temperature applications over about 2000° C. In pure-iridium, pure-molybdenum sensors the solid-phase changes above about 1975° C. could occur in the junction. In high temperature applications it is therefore preferable to employ the previously described alloys of molybdenum and iridium.

The physical and chemical compatibility of molybdenum, iridium and the alloys containing only those two metals, provide a wide variety of compositions to be utilized in the formulation of a bimetallic sensor for thermocouples in accordance with the present invention. The number of useful thermocouple sensor alloys available allows a variety of thermocouple sensors to be formulated to suit a variety of high-vacuum, high-temperature systems including those employing various gaseous atmospheres that do not cause excessive hot corrosion.

The present invention may therefore be implemented in a variety of ways by those skilled in the art to suit particular requirements and may be implemented for example through the use of various insulating and sheathing processes to suit particular requirements. It will be understood that these and various other changes and substitutions may be made within the spirit and scope of the invention as defined in the appended claims.

What is claimed is:

1. In a thermocouple for measuring temperature in high temperature and vacuum systems, the improvement comprising
    a bare bimetallic thermocouple sensor of dissimilar molybdenum, iridium alloys wherein each of said bimetallic thermocouple sensor metals consists of iridium with about 0 to about 22 atomic percent molybdenum dissolved therein, said thermocouple sensor having a melting point in the range of about 2300° C. to about 2450° C.

2. In a thermocouple for measuring temperature in high temperature and vacuum systems, the improvement comprising,
    a bare bimetallic thermocouple sensor of dissimilar molybdenum, iridium alloys wherein each of said bimetallic thermocouple sensor metals consists of molybdenum with about 0 to about 4 atomic percent iridium dissolved therein, said thermocouple sensor having a melting point of about 2620° C.

* * * * *